United States Patent
Cho et al.

(10) Patent No.: US 7,476,585 B2
(45) Date of Patent: *Jan. 13, 2009

(54) SEMICONDUCTOR DEVICE INCLUDING STORAGE NODE AND METHOD OF MANUFACTURING THE SAME

(75) Inventors: Chang-Hyun Cho, Kyungki-do (KR); Tae-Young Chung, Kyungki-do (KR); Cheol-Ju Yun, Kyungki-do (KR); Jae-Goo Lee, Kyungki-do (KR); Ju-Yong Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 23 days.

This patent is subject to a terminal disclaimer.

(21) Appl. No.: 11/621,507

(22) Filed: Jan. 9, 2007

(65) Prior Publication Data
US 2007/0111437 A1    May 17, 2007

Related U.S. Application Data

(62) Division of application No. 10/830,895, filed on Apr. 22, 2004, now Pat. No. 7,180,118.

(30) Foreign Application Priority Data
May 1, 2003    (KR) ............................... 2003-28003

(51) Int. Cl.
*H01L 21/8239* (2006.01)
(52) U.S. Cl. ................. 438/253; 438/396; 257/E21.014
(58) Field of Classification Search ........... 257/E21.014
See application file for complete search history.

(56) References Cited

U.S. PATENT DOCUMENTS

| | | | |
|---|---|---|---|
| 6,381,165 B1 | 4/2002 | Lee et al. | |
| 6,396,096 B1 | 5/2002 | Park et al. | |
| 7,074,667 B2 * | 7/2006 | Cho et al. | 438/238 |
| 2001/0029113 A1 | 10/2001 | Kunitomo et al. | |
| 2002/0084480 A1 | 7/2002 | Basceri et al. | |
| 2004/0108536 A1 | 6/2004 | Lee et al. | |

FOREIGN PATENT DOCUMENTS

| | | |
|---|---|---|
| GB | 2 336 716 A | 10/1999 |
| KR | 1999-0081113 | 11/1999 |

OTHER PUBLICATIONS

English language abstract of British Publication No. GB 2 336 716 A.
English language abstract of Korean Publication No. 1999-0081113.

* cited by examiner

*Primary Examiner*—Stephen W Smoot
(74) *Attorney, Agent, or Firm*—Marger Johnson & McCollom, P.C.

(57) ABSTRACT

A semiconductor device including storage nodes and a method of manufacturing the same: The method includes forming an insulating layer and an etch stop layer on a semiconductor substrate; forming storage node contact bodies to be electrically connected to the semiconductor substrate by penetrating the insulating layer and the etch stop layer; forming landing pads on the etch stop layer to be electrically connected to the storage node contact bodies, respectively; and forming storage nodes on the landing pads, respectively, the storage nodes of which outward sidewalls are completely exposed and which are arranged at an angle to each other.

15 Claims, 13 Drawing Sheets

SEMICONDUCTOR DEVICE INCLUDING STORAGE NODE AND METHOD OF MANUFACTURING THE SAME

This application is a Divisional of U.S. patent application Ser. No. 10/830,895, filed on Apr. 22, 2004, issued as U.S. Pat. No. 7,180,118, which claims the priority of Korean Patent Application No. 2003-28003, filed on May 1, 2003 in the Korean Intellectual Property Office, the disclosure of which is incorporated herein by reference in their entirety.

BACKGROUND OF THE INVENTION

1. Field of the Invention

The present invention relates to a semiconductor device, and more particularly, to a semiconductor device including storage nodes with increased capacitance, and a method of manufacturing the same.

2. Description of the Related Art

Developments in manufacturing semiconductor devices have reduced the size of transistors and increased the integration density. For example large improvements have been made in the integration density of semiconductor memory devices such as dynamic random access memories (DRAMs). With modern methods, it is feasible to produce a 1-giga bit DRAM.

In general, DRAMs include cells each of which includes a single transistor. The cells in such devices can be categorized as either stack-type cells or trench-type cells, depending on the methods of forming the cell capacitor. In a DRAM with a stack-type cell, various approaches have been used to achieve a reduction in design rules and cell capacitors occupying a smaller area. For example, methods have been developed to increase the height of a storage node of a capacitor; to increase the effective surface area using hemi-spherical grains (HSG); and to utilize both the inward and the outward areas of one cylinder storage (OCS) capacitors. Devices with the OCS capacitors are particularly desirable in devices that use reduced design rules.

However, as is known, OCS capacitors sometimes cause twin bit failures. That is, as design rules are reduced, a cylindrical capacitor node is prone to fall down. The reason for this is that when storage nodes are disposed in a 2-dimensional shape, the distance between the storage nodes markedly decreases as design rules are reduced.

FIG. 1 is a schematic plan view of a conventional semiconductor device including conventional OCS-type capacitor storage nodes 50. The storage nodes 50 are disposed in a straight line pattern at right angles to the direction of bit lines 30 and word lines 20 (i.e., gate lines).

For a DRAM formed in the 0.1-μm regime, the area occupied by a storage node is estimated as follows. The length of each rectangular storage node is about 300 nm and the width thereof is about 120 nm. When the storage nodes 50 are disposed in a 2-dimensional shape, the distance between the storage nodes 50 is only about 50 nm. Thus, to obtain the capacitance required for a DRAM, the height of the storage node 50 must be not less than about 1500 nm.

The ratio of height to width of the cylindrical storage node 50 is 12 or higher. That is, since the storage node 50 has a very narrow width and a very high height, it is very prone to fall. If a storage node 50 leans toward the next storage node 50 or if it falls down, it may contact the next storage node 50 because distance between the nodes is only 80 nm. When the storage nodes 50 contact each other, twin bit failure occur. The storage nodes 50 are even more likely to fall down in the sub-0.1-μm regime.

The possibility that the storage nodes 50 will lean and contact the adjacent storage node depends on the arrangement of the storage nodes 50. Accordingly, methods for increasing distance between the storage nodes 50 by altering the arrangement have been proposed.

In the conventional device as shown in FIG. 1, from the plan view, the center of the storage node 50 naturally overlaps a plug-type conductive storage node contact 41, which is formed on an active region 11 of a semiconductor substrate. While the position of the storage node 50 can be altered, the center of the storage node 50 cannot depart from the storage node contact 41. Also, the conductive storage node contact 41 must be electrically isolated from the line contact 45, which is used to electrically connect a bit line 30 with the active region 11 of the semiconductor substrate. For these reasons, altering the position of the conductive storage node contact 41 is difficult.

Therefore, if one desires to change the arrangement of OCS-type storage nodes to prevent a storage node from leaning toward and contacting the next storage node, a new technique of maintaining contact resistance between the storage nodes and electrically connecting them with each other is desired. Also, it is desirable to increase the effective surface area of the storage node so as to secure sufficient capacitance. Even if it is possible to change the arrangement to prevent the storage node from falling down, with reduced design rules one must also take into account the fact that the storage nodes need sufficient effective surface area.

SUMMARY OF THE INVENTION

According to one aspect of the present invention, a method of manufacturing a semiconductor device including storage nodes is provided. The method changes the arrangement to prevent storage nodes from leaning or falling down and it provides the storage nodes with sufficient effective surface area to increase capacitance.

The method of the present invention comprises forming an insulating layer on a semiconductor substrate; forming an etch stop layer on the insulating layer; forming storage node contact bodies to be electrically connected to the semiconductor substrate by penetrating the etch stop layer and the insulating layer; forming landing pads on the etch stop layer to be connected to the storage node contact bodies, respectively; and forming storage nodes on the landing pads, respectively, the storage nodes of which at least outward sidewalls are completely exposed and which are arranged at an angle to each other.

Herein, the landing pad can be formed to have a larger width than that of the storage node contact body in at least one direction. The landing pad can be formed of the same material as the storage node, for example, conductive polysilicon.

The method of the present invention further comprises forming bit lines under the insulating layer. The storage nodes are arranged at an angle to each other in a lengthwise direction of the bit lines. That is, the storage nodes, between which the bit lines are disposed, are arranged in a zigzag pattern. The landing pads expand in a lengthwise direction of the bit lines and thus reach the bottoms of the storage nodes. The landing pads, between which the bit lines are disposed, expand alternately in an opposite direction to each other so that they form a zigzag pattern.

The storage nodes can be formed by forming a mold layer on the etch stop layer having an opening hole exposing the top surface of the landing pad; forming a conductive layer on the mold layer to contact the exposed landing pad; forming the storage nodes by separating the conductive layer; and selectively etching and removing the mold layer by using the etch stop layer as an etch stop point.

The etch stop layer can be formed using an insulating material having an etch selectivity with respect to the mold layer. For example, the etch stop layer can be formed of silicon nitride layer having an etch selectivity with respect to the mold layer, and a silicon layer may be further formed on the silicon nitride layer with a smaller thickness than that of the silicon nitride layer. In this case, the mold layer is removed and the silicon layer is etched leaving the silicon nitride layer.

The storage node is formed on the landing pad in a cylinder shape to expose both the outward and inward sidewalls thereof.

According to another aspect of the present invention, there is provided a semiconductor device including storage nodes. The device comprises an insulating layer formed on a semiconductor substrate; an etch stop layer formed on the first insulating layer; storage node contact bodies which are electrically connected to the semiconductor substrate by penetrating the etch stop layer and the insulating layer; landing pads formed on the etch stop layer to be connected to the storage node contact bodies, respectively; and storage nodes formed on the landing pads, respectively, the storage nodes of which at least outward sidewalls are exposed and which are arranged at an angle to each other.

In the present invention, storage nodes are arranged at an angle to or in a diagonal direction to each other, thereby preventing a storage node from leaning toward and contacting the next storage node. Also, a sufficient effective surface area of the storage node can be secured so as to reliably increase the capacitance of the capacitor.

BRIEF DESCRIPTION OF THE DRAWINGS

The above object and advantages of the present invention will become more apparent by describing in detail preferred embodiments thereof with reference to the attached drawings in which:

FIGS. 2A through 7A, 2B through 7B, and 8A through 8D are schematic cross-sectional view illustrating a method of manufacturing a semiconductor device including storage nodes according to embodiments of the present invention.

DETAILED DESCRIPTION OF THE INVENTION

The present invention will now be described more fully with reference to the accompanying drawings, in which preferred embodiments of the invention are shown.

In the embodiments of the present invention, storage nodes are arranged at an angle to each other, for example, in a diagonal direction relative to each other. Also, landing pads are formed between the storage nodes and plug-shaped storage node contact bodies in order to effectively connect the storage nodes with the storage node contact bodies. Further, to secure a sufficient effective surface area of a storage node, an etch stop layer is formed adjacent to the landing pad so as to completely expose the outward sidewall of the storage node.

Thus, the landing pads can connect the storage nodes, which are arranged at an angle to a lengthwise direction of bit lines (or gate lines), with storage node contact bodies, which are arranged in a lengthwise direction of the bit lines (or the gate lines). As a result, the storage nodes can be reliably formed in a new arrangement.

Also, the outward sidewalls of cylindrical storage nodes can be completely exposed. Thus, since the landing pads can function as a part of storage nodes, the effective surface areas of the storage nodes can be increased. This results in a stable increase in the capacitance of the capacitor.

Hereinafter, the embodiments of the present invention will be more fully described with reference to the appended drawings.

FIGS. 2A through 7A, 2B through 7B, and 8A through 8D are schematic cross-sectional view illustrating a method of manufacturing a semiconductor device including storage nodes according to embodiments of the present invention.

Figure 2A:
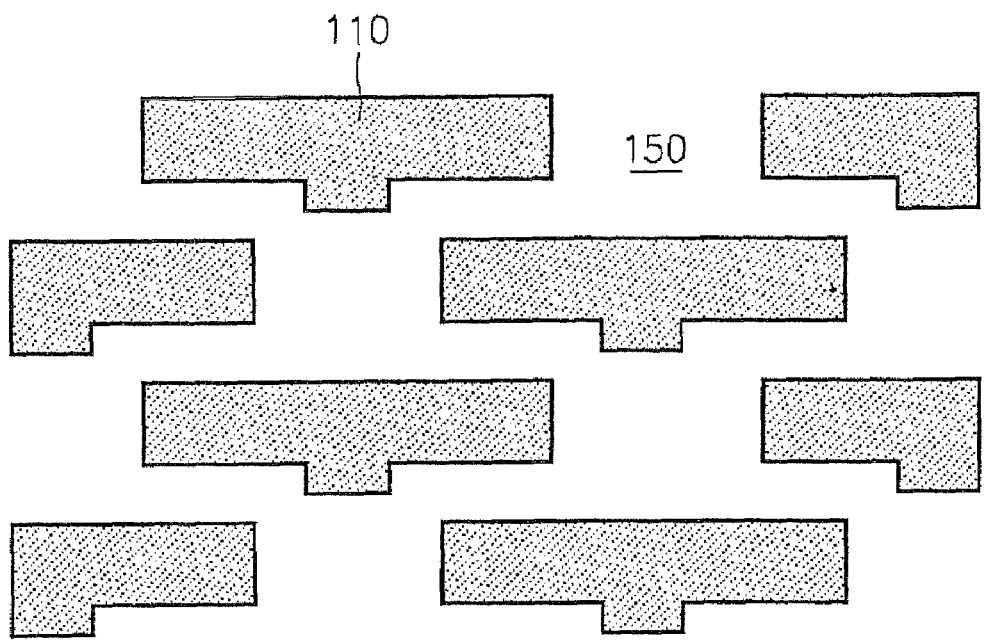
Figure 2B:
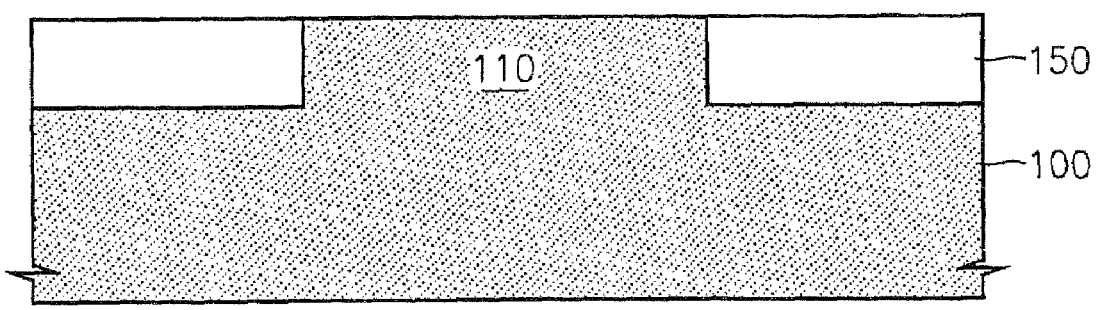

FIG. 2A is a schematic plan view illustrating definition of an active region 110 on a semiconductor substrate, and FIG. 2B is a schematic view of a lengthwise section of the active region 110 shown in FIG. 2A.

Referring to FIGS. 2A and 2B, an isolation region 150 is formed by a device isolation process, such as trench isolation, at a semiconductor substrate 100 formed of silicon to define an active region 110. Although the depth of a trench varies according to design rule, the trench can be typically formed to a depth of about 2500 Å to 3000 Å. Next, a well (not shown) and a channel (not shown) of a transistor are formed in the semiconductor substrate 100 by a photolithography process and ion implantation processes.

Figure 3A:
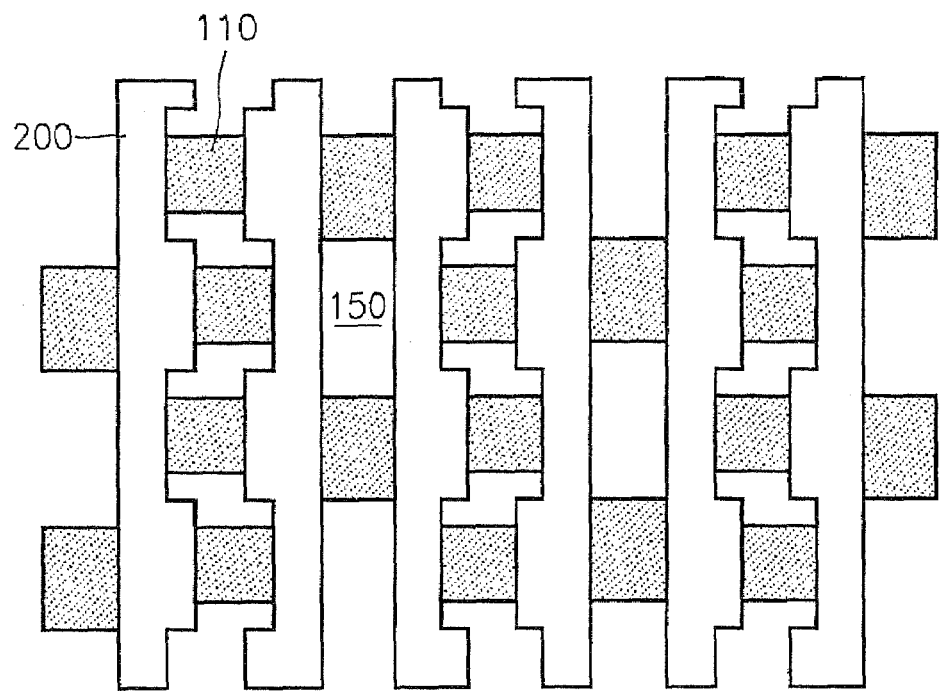
Figure 3B:
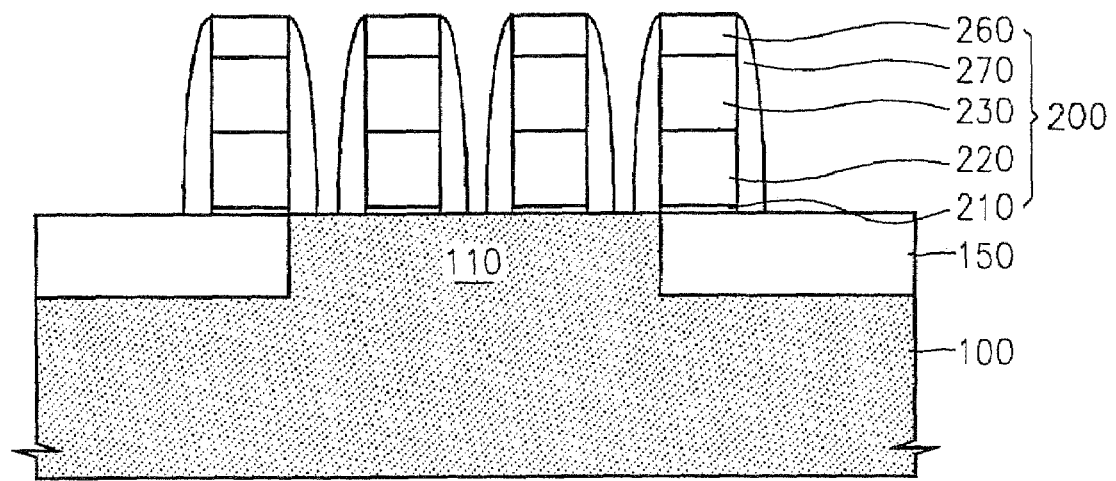

FIGS. 3A and 3B are a schematic plan view and cross-sectional view, respectively, illustrating the formation of gate lines 200 on the semiconductor substrate 100.

Referring to FIGS. 3A and 3B, a plurality of gate lines 200 are formed in a line shape across the active region 110. Specifically, an oxide layer (not shown), which remains on the active region 110 used in the ion implantation process, is removed by a wet etch process. Then, a gate oxide layer 210 is formed on the active region by growing a thermal oxide layer to a thickness of about 40 Å to 60 Å. The thickness of the gate oxide layer 210 varies according to the characteristics of a device.

Thereafter, gate layers 220 and 230 and a gate capping layer 260 are sequentially formed on the gate oxide layer 210. The gate layers 220 and 230 are formed by depositing conductive materials. For example, a conductive doped polysilicon layer 220 is deposited to a thickness of about 1000 Å, and a metal silicide layer, e.g., a tungsten silicide layer 230, is formed thereon to a thickness of about 1000 Å in order to improve the conductivity of a gate. A silicon nitride layer for a capping insulating layer 260 is formed on the tungsten silicide layer 230 to a thickness of about 2000 Å, to protect the gate from etching damage in a subsequent etch process.

Thereafter, the capping insulating layer 260 and the gate layers 220 and 230 are sequentially patterned using photolithography and etch processes, thereby forming a plurality of gate patterns. Then, a photolithography process and ion implantation processes are carried out in consideration of the characteristics and regions of NMOS transistors or PMOS transistors. Thus, lightly doped drain (LDD)-type source regions and/or drain regions of transistors are formed.

Next, an insulating layer is deposited to cover the gate pattern and then etched, thereby forming a gate spacer 270. The gate spacer 270 can be formed using silicon nitride to protect the sidewall of the gate pattern. Eventually, the arrangement of the gate lines 200 is completed.

Figure 4A:
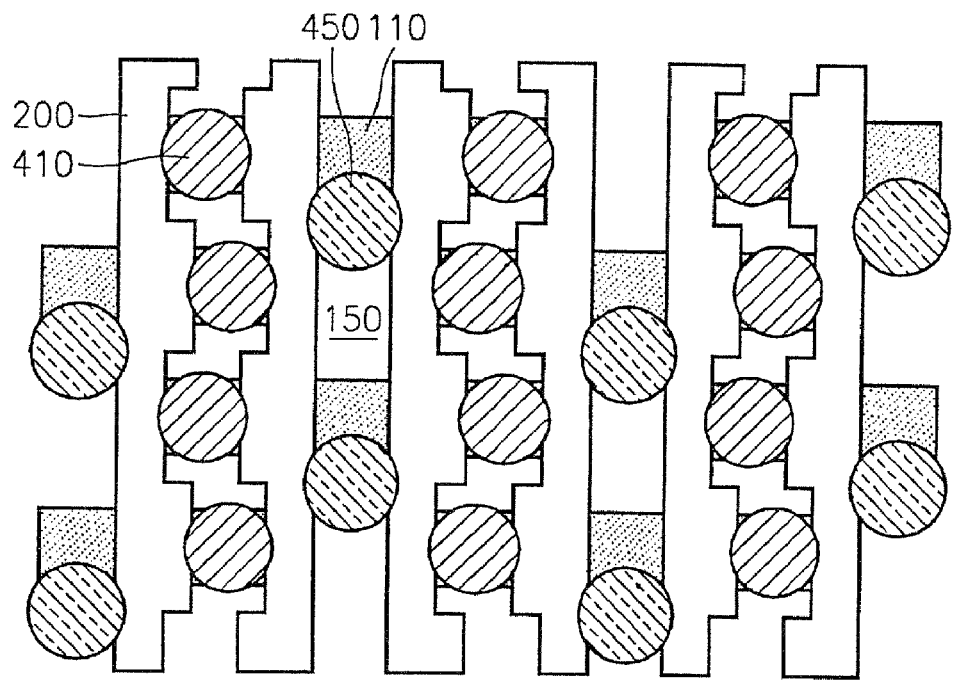
Figure 4B:
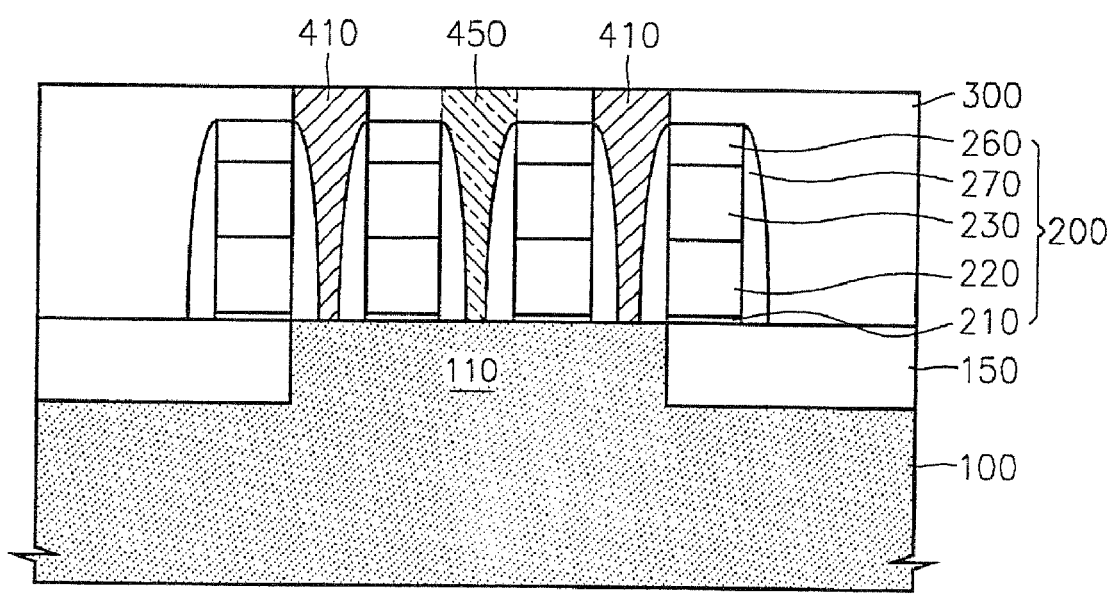

FIGS. 4A and 4B are a schematic plan view and cross-sectional view, respectively, illustrating formation of contact pads 410 and 450.

Referring to FIGS. 4A and 4B, a first insulating layer 300 is formed to fill vacancies between the gate lines 200. The first insulating layer 300 can be formed of silicon oxide having a good gap filling characteristic, such as high density plasma (HDP) oxide and BoroPhosphoSilicate Glass (BPSG). Next, the top surface of the first insulating layer 300 can be optionally planarized. This planarization process can be carried out using chemical mechanical polishing (CMP).

Thereafter, a plurality of contact pads 410 and 450 are formed in the first insulating layer 300 using a self-aligned contact (SAC) process. The contact pads 410 and 450 are classified into a first contact pad 410 (i.e., a buried contact (BC) pad) for electrical connection with a storage node and a second contact pad (i.e., a direct contact (DC) pad) for electrical connection with a bit line. Substantially, the first contact pad 410 and the second contact pad 450, between which the gate line 200 is disposed, are formed at an angle to each other.

To form the contact pads 410 and 450, for example, a portion of the first insulating layer 300, which corresponds to a region where a bit line contact and a storage node contact will be formed, is selectively removed using photolithography and selective etch processes, thereby forming first contact holes for contact pads to expose the active region 110.

Next, impurity ions are implanted into an exposed portion of the active region 110 so as to reduce contact resistance between the active region 110 and the contact pads 410 and 450. For example, to form an NMOS transistor, phosphorus ions are implanted at a dose of about 2 e12/cm2 to 4 e12/cm2 and at an energy of about 30 KeV to about 50 KeV. Then, a conductive material, such as N-type doped polysilicon, is deposited to a thickness of about 5000 Å, to fill the first contact holes. The resultant conductive layer is dry etched by an etchback process or polished by CMP until the top surface of the first insulating layer 300 is exposed. Thus, the contact pads 410 and 450 filled in the first contact holes are formed.

Figure 5A:
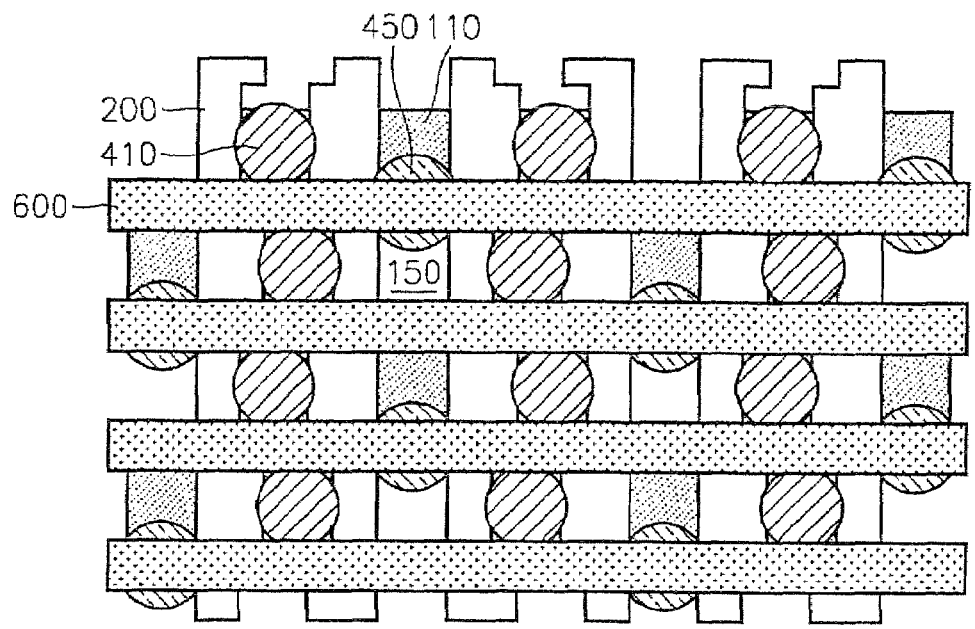
Figure 5B:
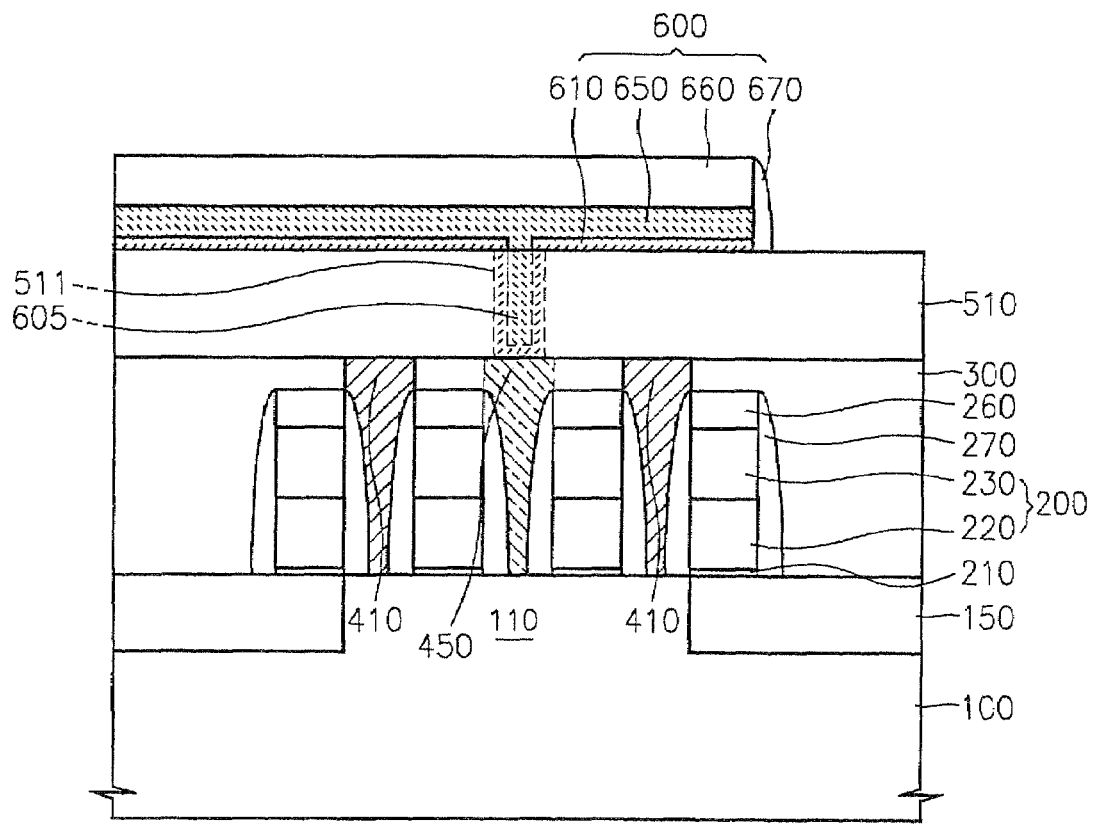

FIGS. 5A and 5B are a schematic plan view and cross-sectional view, respectively, illustrating formation of bit lines 600.

Referring to FIGS. 5A and 5B, a second insulating layer 510 is formed on the first insulating layer 300 to cover the contact pads 410 and 450. The second insulating layer 510 is formed to electrically insulate a bit line from the BC pad, i.e., the first contact pad 410. Accordingly, the second insulating layer 510 can be formed using an insulating material, such as silicon oxide, to a thickness of about 1000 Å to 2000 Å.

Next, a second contact hole 511 is formed using photolithography and etch processes by penetrating the second insulating layer 510 to selectively expose the top surface of the second contact pad 450, i.e., the DC pads. The second contact hole 511 is formed to form a second contact, i.e., a DC, which electrically connects the second contact pad 450 with a bit line 600.

Thereafter, the bit line 600, which is electrically connected to the second contact pad 450, is formed through a typical bit line forming process. For example, a metal barrier layer 610 and a conductive metal layer 650, such as a tungsten layer of about 500 Å to 1500 Å thickness, are deposited and then patterned to form the bit line 600. Here, a conductive polysilicon layer may be used in place of the tungsten layer. A second contact 605 (i.e., a DC) fills the second contact hole 511 to electrically connect the bit line 600 with the second contact pad 450.

A silicon nitride layer for a bit line capping insulating layer 660 may be formed on the bit line 600 to a thickness of about 2000 Å, and another silicon nitride layer for a bit line spacer 670 may be formed on sides of the bit line 600. The capping insulating layer 600 and the spacer 670 are preliminarily formed to prevent damage to the bit line 600 during, for example, formation of a BC.

Figure 6A:
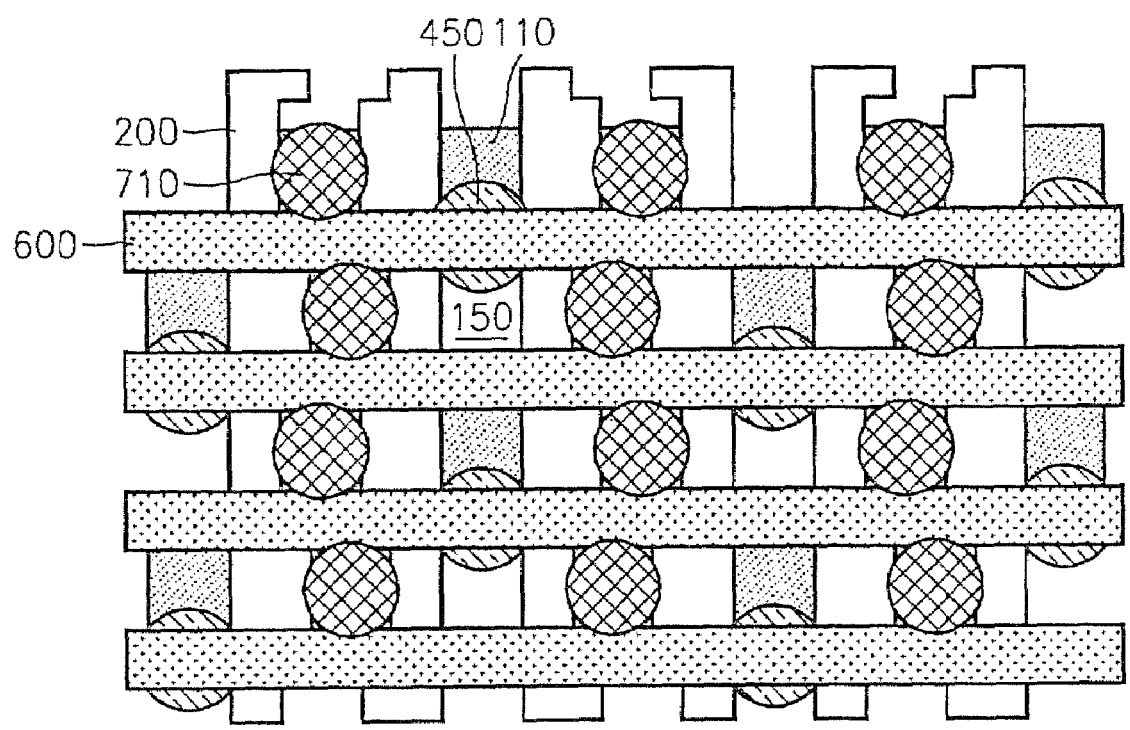
Figure 6B:
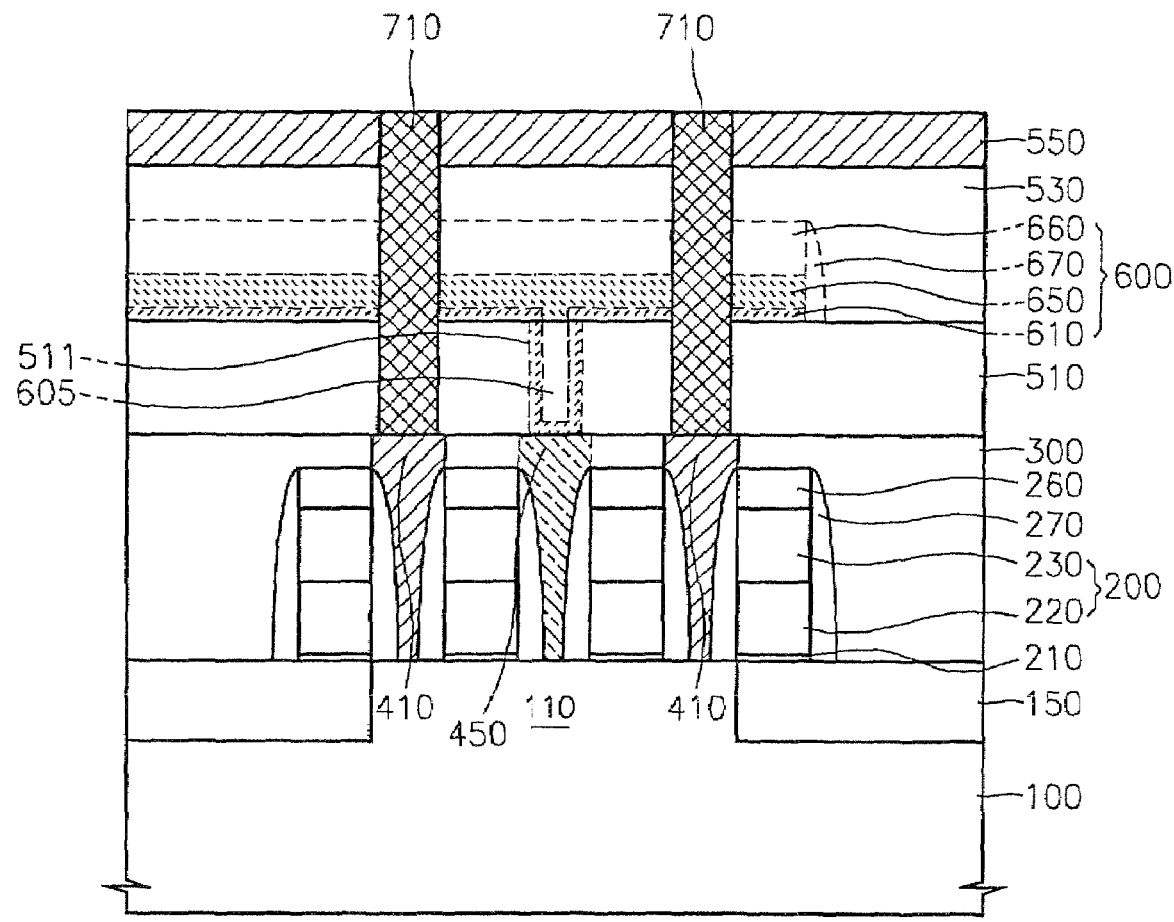

FIGS. 6A and 6B are a schematic plan view and cross-sectional view, respectively, illustrating formation of an etch stop layer 550 and a storage node contact 710.

Referring to FIGS. 6A and 6B, after the bit line 600 is formed, a third insulating layer 530 is formed to cover the bit line 600. For example, to form the third insulating layer 530, a silicon oxide layer having a good gap filling characteristic, such as HDP oxide and BPSG, is deposited to a thickness of about 2000 Å. Then, the surface of the third insulating layer 530 is optionally planarized. The planarization process may be performed using CMP.

An etch stop layer 550 is formed on the third insulating layer 530. The etch stop layer 550 is formed by depositing a 2000 Å thick silicon nitride layer or depositing a double layer of a 2000 Å thick silicon nitride layer and a 1000 Å thick silicon layer.

Thereafter, the etch stop layer 550 and the third insulating layer 530 are sequentially and selectively etched using photolithography and etch processes, thereby forming a third contact hole exposing the first contact pad 410. A conductive layer, e.g., a conductive polysilicon layer, is formed by chemical vapor deposition (CVD) to a thickness of about 1000 Å to 2000 Å, to fill the third contact hole. Thus, a BC, i.e., a storage node contact body 710, is formed to electrically connect a storage node with the first contact pad 410.

Figure 7A:
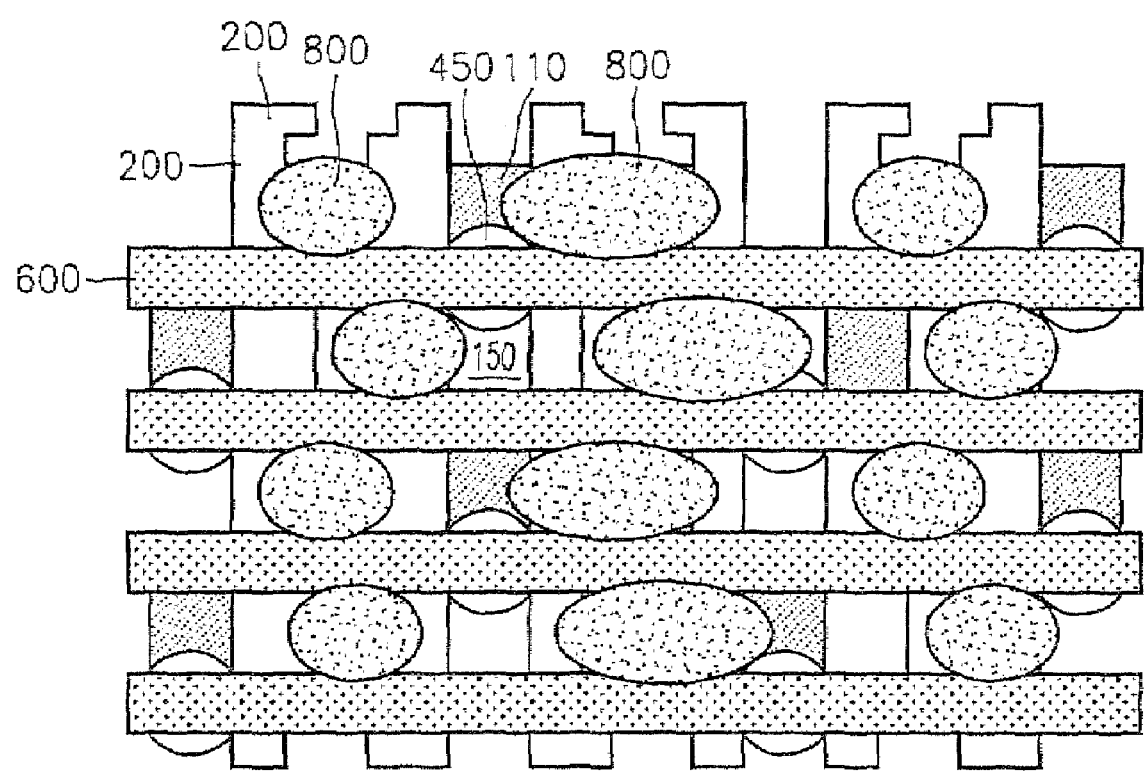
Figure 7B:
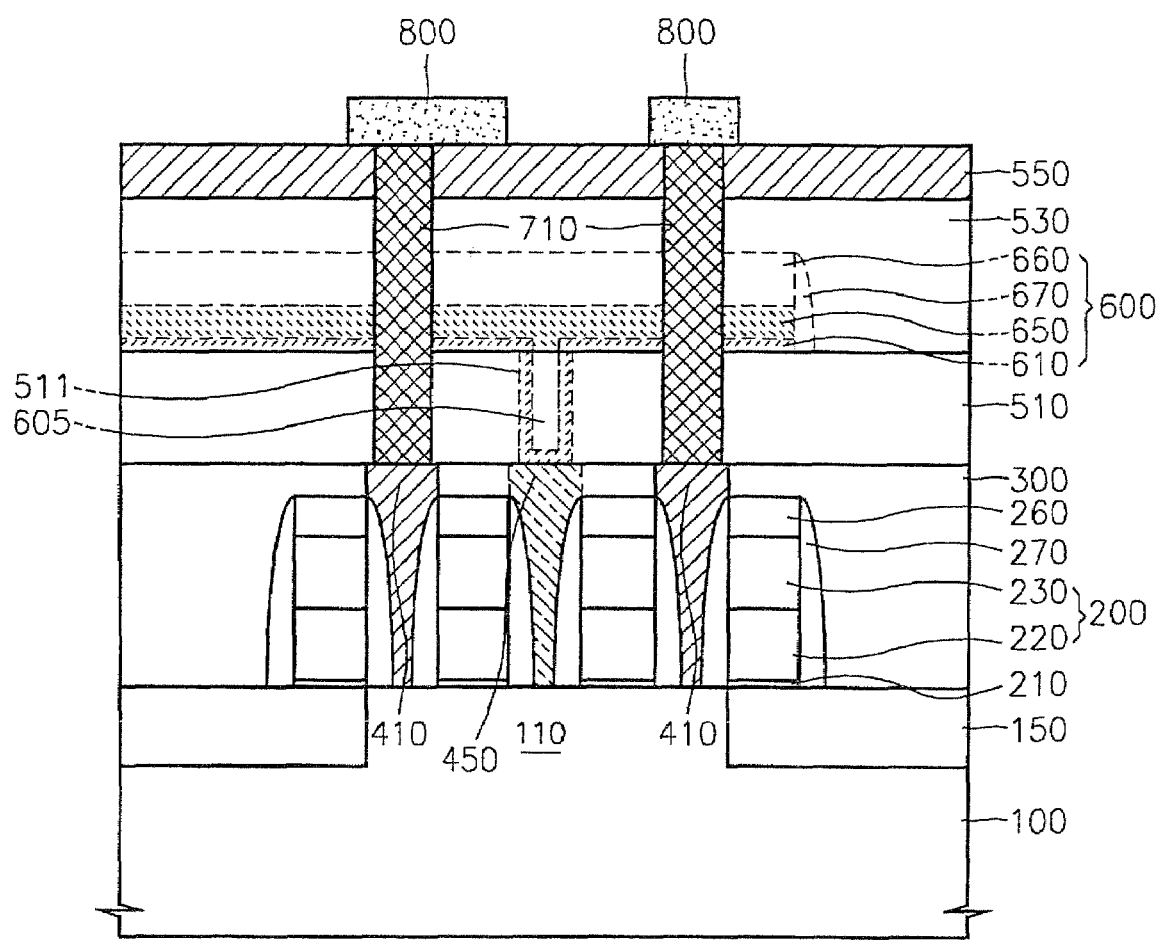

FIGS. 7A and 7B are a schematic plan view and cross-sectional view, respectively, illustrating formation of a landing pad 800 on the etch stop layer 550.

Figure 1:
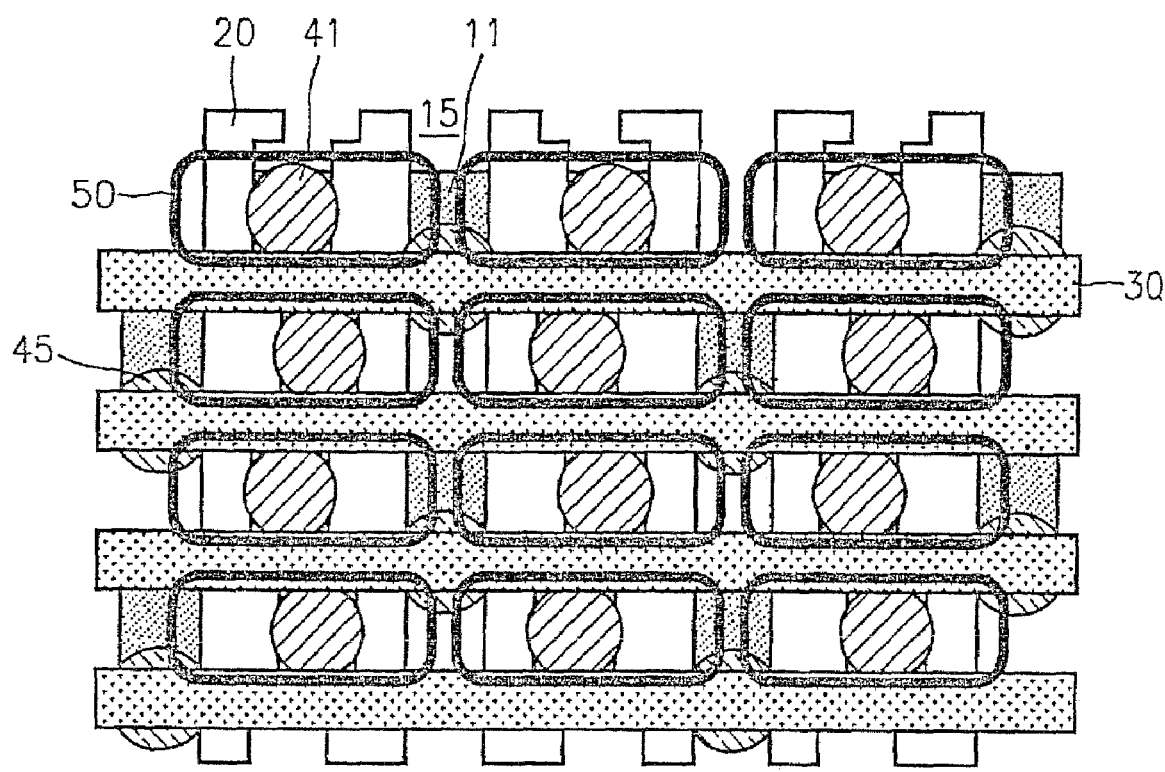
FIG. 1 is a schematic cross-sectional view of a conventional semiconductor device including storage nodes.

Referring to FIGS. 7A and 7B, a landing pad 800, which is electrically connected to the storage node contact body 710, is formed on the etch stop layer 550 and the storage node contact body 710. In the present invention, since storage nodes are disposed in a different arrangement from those shown in FIG. 1, the storage node may depart from the center of the storage node contact body. For this reason, the landing pad 800 is used to ensure electrical connection between the storage node contact body and the storage node.

The process of forming the landing pad 800 comprises depositing a conductive doped polysilicon layer on the storage node contact body 710 to a thickness of about 1000 Å to 2000 Å and patterning the polysilicon layer using photolithography and etch processes. The resultant landing pad 800 is formed to expand in a lengthwise direction of the bit line 600, as shown in FIG. 7. Also, two adjacent landing pads 800, between which one bit line 600 is disposed, expand in an opposite direction to each other. Accordingly, the landing pads 800 are arranged to be zigzag with respect to a lengthwise direction of the gate lines 200, which substantially intersect the bit lines 600.

Although it is possible to form the landing pads 800 of the same size, they may also have different sizes. That is, two adjacent landing pads 800, between which one gate line 200 is disposed, may be formed having different sizes, as shown in FIG. 7B. That is, larger landing pads 800 and smaller landing pads 800 may be alternately formed in a lengthwise direction of the bit lines 600.

Figure 8A:
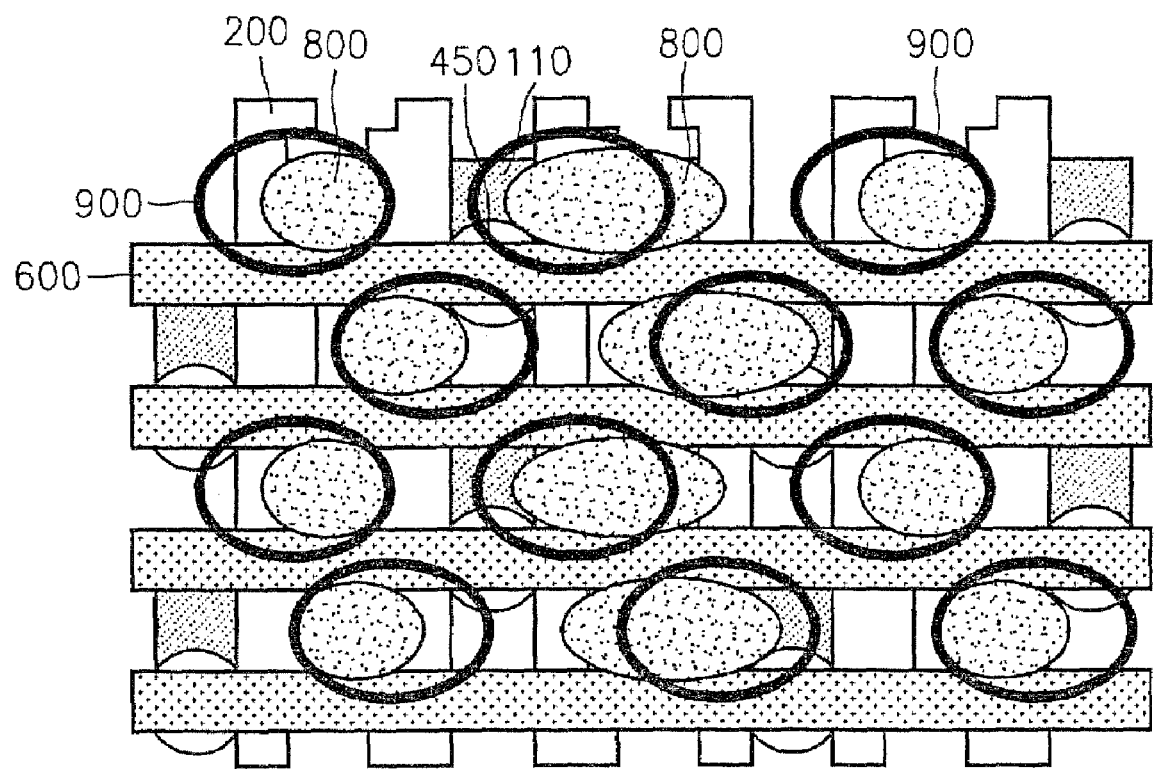
Figure 8B:
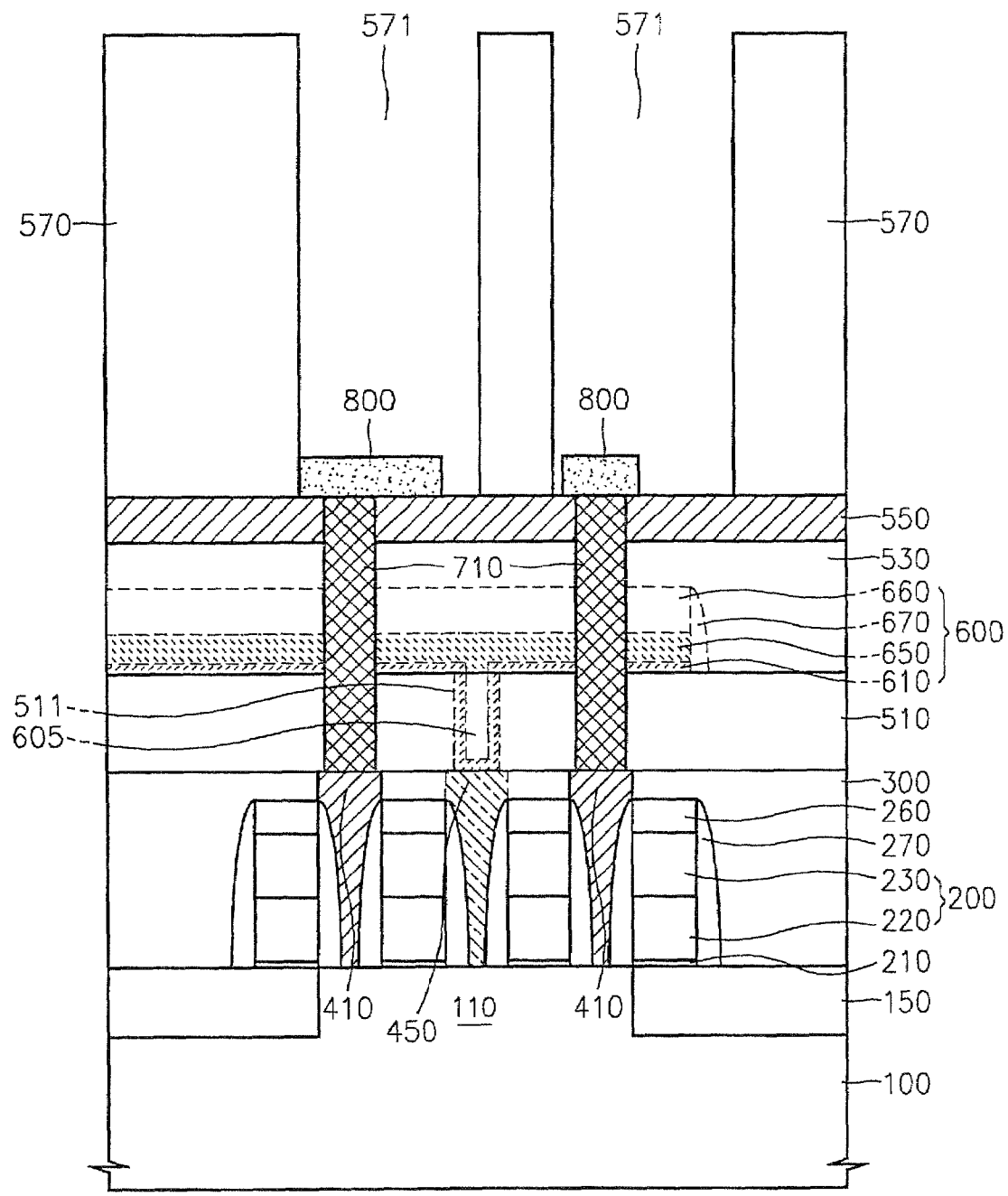
Figure 8C:
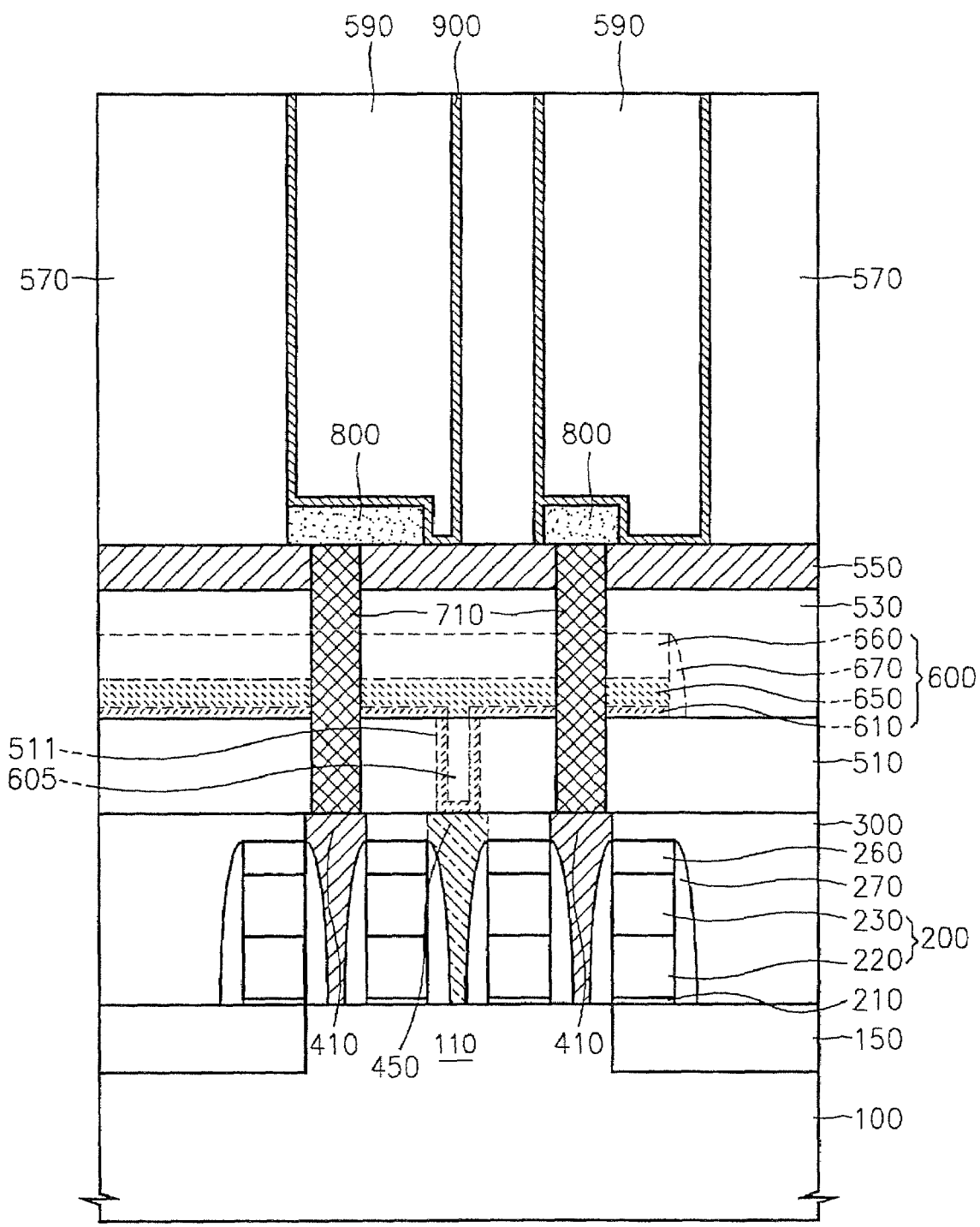
Figure 8D:
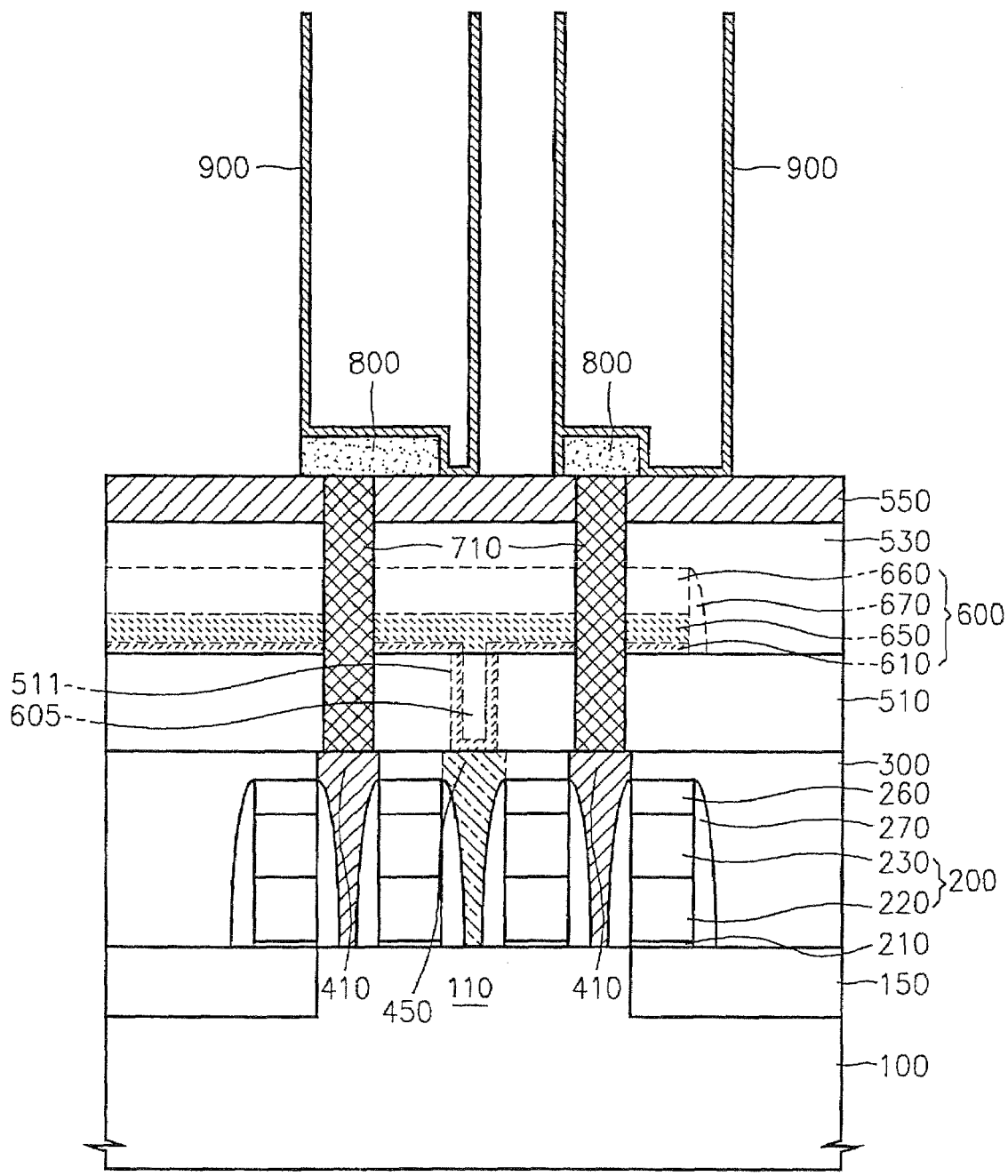

FIG. 8A is a schematic plan view illustrating the formation of storage nodes 900, and FIGS. 8B through 8D are schematic cross-sectional views illustrating the formation of the storage nodes 900.

Referring to FIG. 8A, a storage node 900 of a capacitor is formed on the landing pad 800. The storage node 900 is formed in a 3-dimensional shape, for example, a cylindrical shape. The cross section of a cylindrical storage node may have a square, circular, or elliptical shape.

Also, the storage nodes 900 are arranged at an angle to or diagonally to each other. That is, as shown in FIG. 8A, the storage nodes 900 are arranged at an angle to or in a diagonal direction of, i.e., along imaginary lines drawn diagonally with respect to a lengthwise direction of the gate lines 200 or the bit lines 600. Accordingly, the storage nodes 900 are arranged in a zigzag pattern in a lengthwise direction of the gate lines 200 or the bit lines 600.

When the storage nodes 900 are arranged as described above, for about 0.1-μm design rules, if the section of the storage node 900 is rectangular, the length of the storage node 900 becomes about 250 nm and the width thereof becomes about 200 nm. If the height of the cylindrical storage node 900 is the same (i.e., about 1500 Å) as the conventional storage node described with reference to FIG. 1, a ratio of height to width in the storage node 900 becomes about 8, i.e., only ⅔ a ratio of height to width in the conventional storage node. Therefore, the leaning of the storage nodes 900 can be effectively prevented.

When the storage nodes 900 are arranged as described above, if the height of the storage node 900 is the same as the conventional storage node, the effective area of the storage node 900 can be reduced to about 10% less than that of the conventional storage node. The reduction in the effective area of the storage node 900 can be compensated by increasing the height thereof. Also, the capacitance of a capacitor can be increased by securing a sufficient effective area of the storage node 900 as described later. The increase in capacitance can reach about 20% more than in the conventional storage node.

Referring to the plan view of FIG. 8A and the cross-sectional views of FIGS. 8B through 8D, in the present embodiment, the outward sidewalls of the storage nodes 900 are completely exposed so that the effective surface area can be maximized. Because of the etch stop layer 550 formed under the landing pad 800, the landing pad 800 under the storage node 900 substantially can function as a part of a storage node.

More specifically, as shown in FIG. 8B, a mold layer 570 with an opening hole 571 exposing the landing pad 800 is formed on the etch stop layer 550. The mold layer 570 is formed by forming a sacrificial insulating layer on the etch stop layer 550 to cover the landing pad 800 and patterning the sacrificial insulating layer using photolithography and etch processes. Here, the sacrificial insulating layer can be deposited using a silicon oxide layer, such as a PE-TEOS layer, to a thickness of about 15000 Å. In the present embodiment, the sacrificial insulating layer may be formed to a height higher than 15000 Å, i.e., as high as the storage node 900.

Referring to FIG. 8C, a conductive layer, e.g., a conductive polysilicon layer, is deposited on the mold layer 570 to a thickness of about 400 Å to 500 Å. Next, a sacrificial layer 590 is formed to fill the opening hole 571 by deposit silicon oxide, such as PE-TEOS and USG, to a thickness of about 3000 Å to 6000 Å. Then, a dry etch process and/or a CMP process is performed until the top surface of the mold layer 570 is exposed. Thus, a portion of the conductive layer, which remains on the mold layer 570, is etched and removed by about 1000 Å to 2000 Å. Eventually, the conductive layer is separated into individual storage nodes 900, each of which takes on a cylindrical shape due to the shape of the mold layer 570.

Referring to FIG. 8D, the mold layer 570 and the remaining sacrificial layer 590 are selectively removed, thus exposing the outward and inward sidewalls of the cylindrical storage node 900. Here, the selective removal employs a high etch selectivity between the silicon oxide layer constituting the mold layer 570 and the remaining sacrificial layer 590, and the polysilicon layer constituting the storage node 900. For example, the selective removal is carried out through a wet etch process using a high etch selectivity between silicon oxide and polysilicon.

When the mold layer 570 and the sacrificial layer 590 are removed, the etch stop layer 550 formed under the landing pad 800 serves as an etch stop point. Since the silicon nitride constituting the etch stop layer 550 has a sufficient etch selectivity with respect to the silicon oxide constituting the mold layer 570 and the sacrificial layer 590, it can function as the etch stop point, thus protecting the third insulating layer 530 from damage caused by the etch process. Even if the etch process is completed, the etch stop layer 550 remains to a thickness of about 500 Å or more.

As described above, the etch process for removing the mold layer 570 is completed using the etch stop layer 550 formed under the landing pad 800 as an etch stop point. Thus, the sidewall of the landing pad 800 may be exposed due to the etch process. In other words, as shown in FIG. 8D, the outward sidewall of the cylindrical storage node 900 is completely exposed, and the landing pad 800 can substantially function as a part of the storage node 900. Further, it can be seen that the surface area of the storage node 900 further expands and includes the sidewall of the landing pad 800. This is because a capacitor dielectric layer will be formed on both the exposed surface of the storage node 900 and the surface of the landing pad 800 in a subsequent capacitor forming process.

As explained thus far, as a sufficient effective surface area of the storage node 900 can be secured, the capacitance of a capacitor using the storage node 900 can be effectively increased.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   forming an insulating layer on a semiconductor substrate;
   forming an etch stop layer on the insulating layer;
   forming storage node contact bodies to be electrically connected to the semiconductor substrate, the storage node contact bodies extending through the etch stop layer and the insulating layer;
   forming landing pads on the etch stop layer and the storage node contact bodies; and
   forming storage nodes on the landing pads, the storage nodes having at least outward sidewalls that are substantially completely exposed.

2. The method of claim 1, wherein the storage nodes are arranged at an angle to each other.

3. The method of clam 1, wherein the landing pad is formed to have a larger width than that of the storage node contact body in at least one direction.

4. The method of claim 1, wherein the landing pad is formed of the same material as the storage node.

5. The method of claim 4, wherein the landing pad comprises polysilicon.

6. The method of claim 1, further comprising forming bit lines under the insulating layer,
   wherein the storage nodes are arranged at an angle to each other in a lengthwise direction of the bit lines such that the storage nodes are disposed in a zigzag pattern, wherein the bit lines are disposed between the storage nodes.

7. The method of claim 6, wherein the landing pads extend in a lengthwise direction of the bit line so as to reach the bottom of the storage node.

8. The method of claim 6, wherein the landing pads are disposed in a zigzag pattern, and wherein the bit lines are disposed between the landing pads.

9. The method of claim 1, wherein the formation of the storage nodes comprises:
   forming a mold layer on the etch stop layer, the mold layer having an opening to expose a top surface of the landing pad;
   forming a conductive layer on the mold layer to contact the exposed landing pad;
   separating the conductive layer, thereby forming the storage nodes; and
   selectively removing the mold layer using the etch stop layer as an etch stop point.

10. The method of claim 9, wherein the etch stop layer is formed of an insulating material having an etch selectivity with respect to the mold layer.

11. The method of claim 10, wherein the etch stop layer is formed of a silicon nitride layer having an etch selectivity with respect to the mold layer.

12. The method of claim 11, further comprising forming a silicon layer on the silicon nitride layer to a smaller thickness than that of the silicon nitride layer.

13. The method of claim 12, wherein the removal of the mold layer is performed until the silicon layer is removed to expose a portion of the silicon nitride layer.

14. The method of claim 1, wherein the storage node is formed on the landing pad in a cylinder shape to expose both the outward and inward sidewalls of the storage node.

15. The method of claim 1, wherein storage nodes are respectively formed over the storage node contact bodies.

* * * * *